United States Patent
Li et al.

(10) Patent No.: US 6,678,158 B2
(45) Date of Patent: Jan. 13, 2004

(54) HEAT SINK ASSEMBLY WITH FIXING DEVICE

(75) Inventors: Liang Hui Li, Shenzhen (CN); Tsung-Lung Lee, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/128,097

(22) Filed: Apr. 22, 2002

(65) Prior Publication Data

US 2003/0169569 A1 Sep. 11, 2003

(51) Int. Cl.[7] .................................................. H05K 7/20
(52) U.S. Cl. ........................ 361/697; 165/121; 165/80.3; 257/722; 415/177
(58) Field of Search ................................ 165/121–126, 165/80.3; 415/66, 177, 178, 213.1, 214.1; 454/184; 174/16.3; 257/721, 722; 312/236; 361/687, 690, 695, 697, 703, 704, 717–719

(56) References Cited

U.S. PATENT DOCUMENTS

| | | | | |
|---|---|---|---|---|
| 5,494,098 A | * | 2/1996 | Morosas | 165/121 |
| 5,630,469 A | * | 5/1997 | Butterbaugh et al. | 165/80.3 |
| 5,701,951 A | * | 12/1997 | Jean | 165/121 |
| 6,104,609 A | * | 8/2000 | Chen | 361/695 |
| 6,330,906 B1 | * | 12/2001 | Wang | 165/80.3 |
| 6,343,013 B1 | * | 1/2002 | Chen | 361/695 |
| 6,419,008 B1 | * | 7/2002 | Wu | 165/80.3 |

* cited by examiner

*Primary Examiner*—Gerald Tolin
(74) *Attorney, Agent, or Firm*—Wei Te Chung

(57) ABSTRACT

A heat sink assembly includes a fixing device (10), a fin member (40), and a fan (50). The fixing device is integrally formed by extruding aluminum. The fixing device includes a base (12), two side plates (16) extending upwardly from opposite sides of the base, and an upper plate (18) connecting the side plates and being parallel to the base, thereby defining a space therebetween accommodating the fin member. Four threaded holes (22) are defined in four corners of the upper plate of the fixing device. The fin member is formed by continually bending a metal sheet to yield a concertina-like structure. The fan is box-shaped, and has four through holes (52) defined in four corners thereof. Four screws (60) extend through the through holes of the fan and engage in the threaded holes of the fixing device, thereby attaching the fan to the fixing device.

1 Claim, 4 Drawing Sheets

# HEAT SINK ASSEMBLY WITH FIXING DEVICE

BACKGROUND OF THE INVENTION

1. Field of the Invention

The present invention relates to heat sink assemblies, and particularly to a heat sink assembly having a fixing device for readily and firmly attaching a fan thereto.

2. Prior Art

Developments in today's highly information-intensive society have led to remarkable improvements in performances of electronic devices. During operation of many contemporary electronic devices such as CPUs, large amounts of heat are produced. Such heat must be quickly removed from the electronic device, to prevent the device from becoming unstable or being damaged. Typically, a heat sink together with a fan is attached to an outer surface of the device to facilitate removal of heat therefrom.

Referring to FIG. 4, a conventional heat dissipating assembly comprises a heat sink 200, a fan 300, and a fixing device 100 for attaching the fan 300 to the heat sink 200. The heat sink 200 has a base 210, and a plurality of fins 220 extending upwardly therefrom. A pair of threaded holes 230 is defined in each of opposite side faces of the base 210. The fixing device 100 comprises a frame 120, a pair of legs 140 depending from each of opposite sides of the frame 120, and four locking posts 110 extending upwardly from four corners of the frame 120. An aperture 150 is defined in a distal end of each leg 140, corresponding to one of the threaded holes 230 of the heat sink 200. A screw 250 is extended through each aperture 150 of the fixing device 100 and engaged in a corresponding threaded hole 230 of the heat sink 200, thereby attaching the fixing device 100 to the heat sink 200. Crisscrossed slots 160 are defined in a top portion of each post 110, for providing elastic deformability. Four through holes 320 are defined in four corners of the fan 300. In assembly, the top portions of the posts 110 are resiliently extended through the through holes 320 of the fan 300. Once the top portions protrude from a top of the fan 300, they resiliently expand back to their original orientations. The fan 300 is thereby attached to the heat sink 200 by the fixing device 100.

However, the fixing device 100 and the heat sink 200 are two separate parts. The fixing device 100 must be attached to the heat sink 200 with numerous screws 250, which makes the assembly process unduly complicated and cumbersome. Furthermore, in operation, the screws are prone to be loosened by vibration and create noise.

An improved means of securing a fan to a heat sink which overcomes the above problems is desired.

BRIEF SUMMARY OF THE INVENTION

Accordingly, an object of the present invention is to provide a heat sink assembly having a fixing device which firmly and reliably attaches a fan thereto.

Another object of the present invention is to provide a heat sink assembly which is easily assembled and thus lowers costs.

To achieve the above-mentioned objects, a heat sink assembly of the present invention comprises a fixing device, a fin member and a fan. The fixing device is integrally formed by extruding aluminum. The fixing device comprises a base, two side plates extending upwardly from opposite sides of the base, and an upper plate connecting the side plates and being parallel to the base, thereby defining a space therebetween accommodating the fin member. Four threaded holes are defined in four corners of the upper plate of the fixing device. The fin member is formed by continually bending a metal sheet to yield a concertina-like structure. The fan is box-shaped, and has four through holes defined in four corners thereof. Four screws extend through the through holes of the fan and engage in the threaded holes of the fixing device, thereby attaching the fan to the fixing device.

Other objects, advantages and novel features of the present invention will be drawn from the following detailed description of preferred embodiments of the present invention with the attached drawings, in which:

DESCRIPTION OF THE PREFERRED EMBODIMENTS

Figure 1:
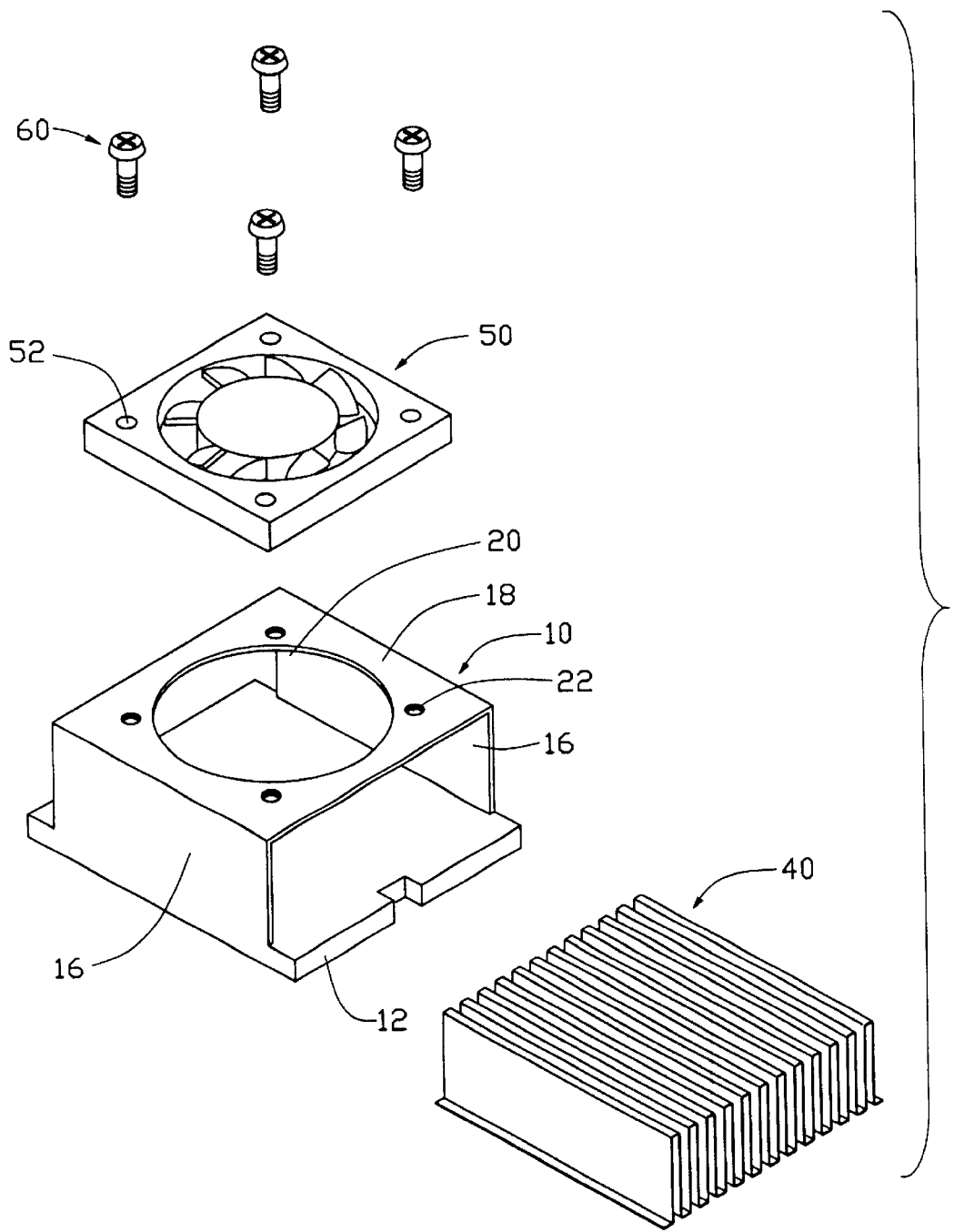
FIG. 1 is an exploded perspective view of a heat sink assembly in accordance with a preferred embodiment of the present invention.

Referring to FIG. 1, a heat sink assembly in accordance with a preferred embodiment of the present invention comprises a fixing device 10, a heat dissipating fin member 40 and a fan 50.

The one-piece fixing device 10 is integrally formed by extruding aluminum. The fixing device 10 comprises a heat dissipating base 12, two opposing side plates 16 extending upwardly from opposite sides of the base 12 respectively, and an upper plate 18 connecting the two side plates 16 and being parallel with the base 12, thereby defining a space (not labeled) therebetween. With successive/secondary mechanical operations, an opening 20 is defined in a center of the upper plate 18, for providing airflow access, and a threaded hole 22 is defined in each of four corners of the upper plate 18.

The fin member 40 is formed by continually bending a metal sheet to yield a concertina-like structure. The fan 50 is generally box-shaped, and has four through holes 52 defined in four corners thereof respectively. Four screws 60 are provided for attaching the fan 50 to the fixing device 10.

Figure 2:
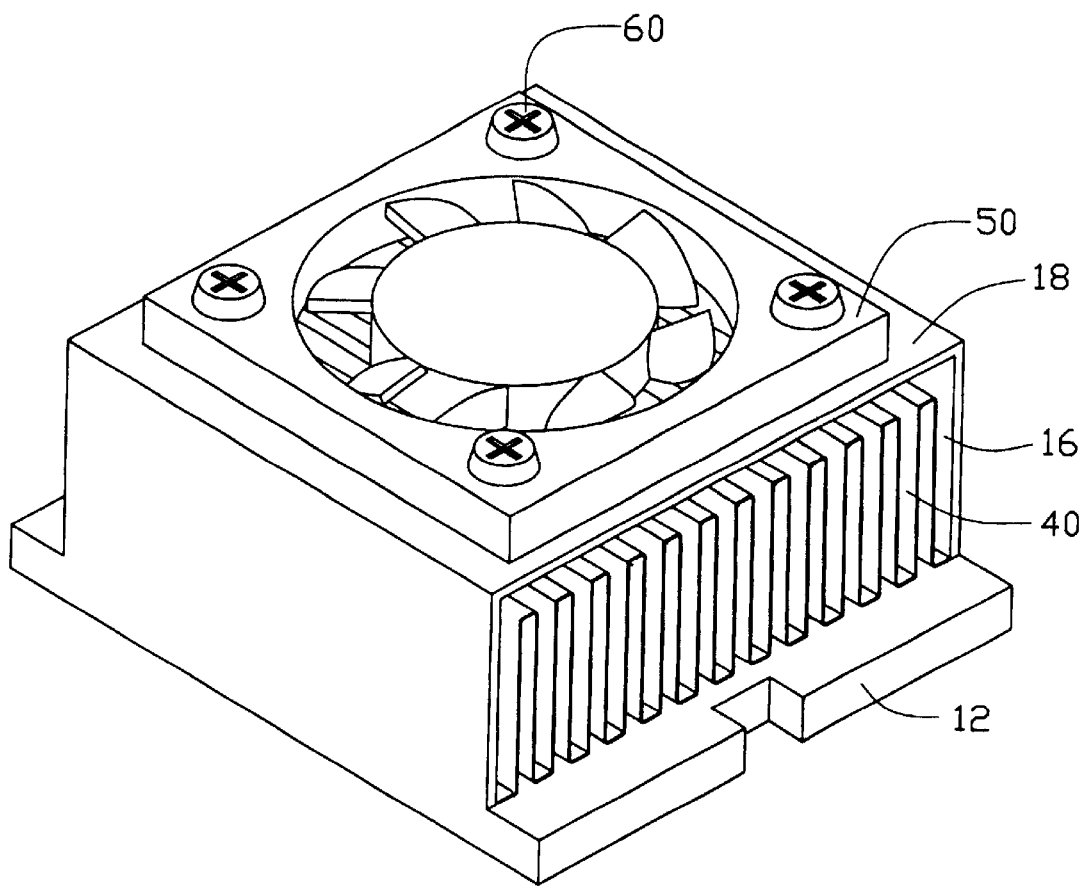
FIG. 2 is an assembled view of FIG. 1.

Referring also to FIG. 2, in assembly, the fin member 40 is mounted to a top surface of the base 12 of the fixing device 10 by conventional means, so that is accommodated within the space (not labeled) of the fixing device 10. The fan 50 is attached onto the upper plate 18 of the fixing device 10. The screws 60 are extended through the through holes 52 of the fan 50 and engaged in the corresponding threaded holes 22 of the fixing device 10.

Figure 3:
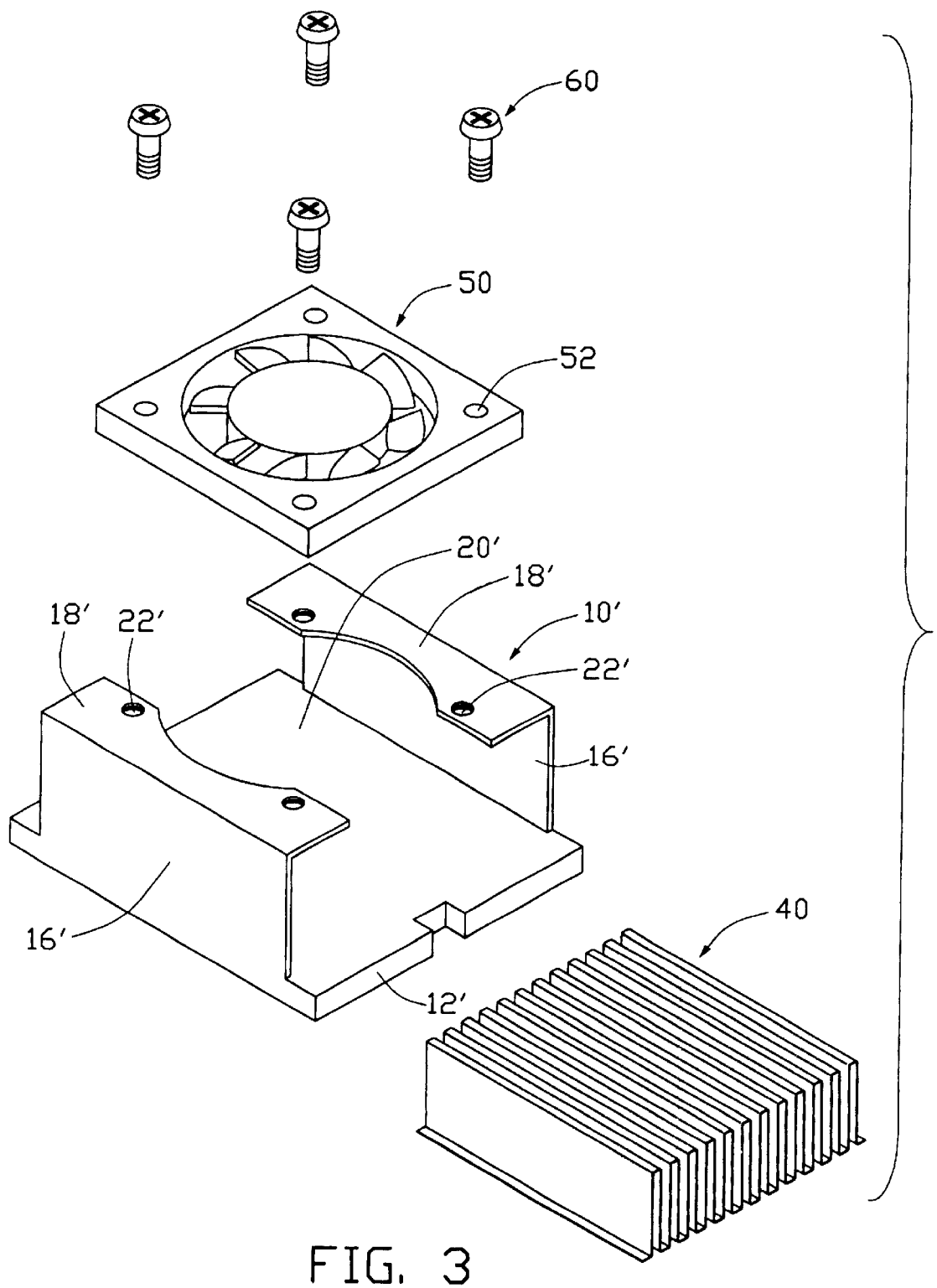
FIG. 3 is an exploded perspective view of a heat sink assembly in accordance with an alternative embodiment of the present invention.
Figure 4:
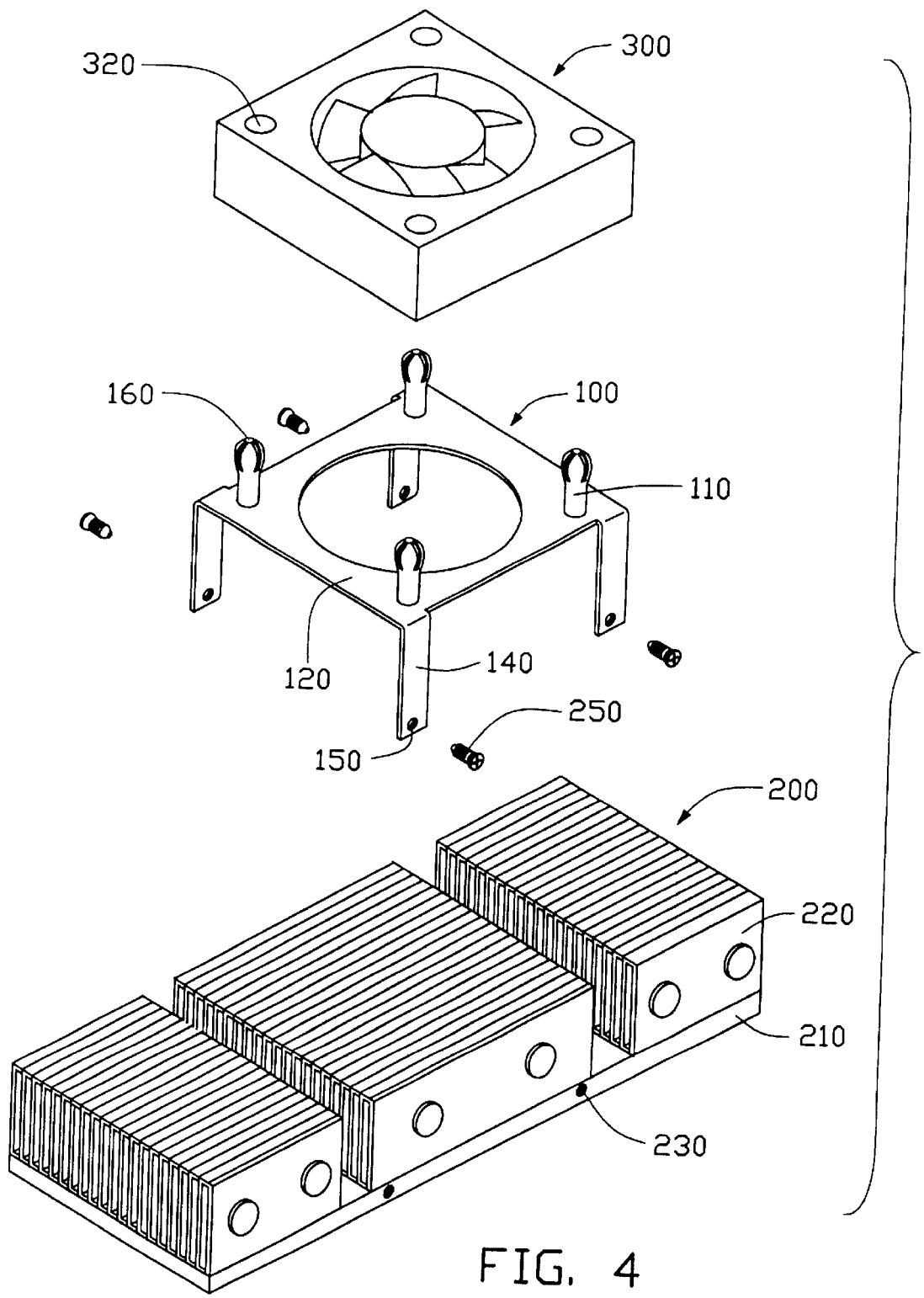
FIG. 4 is an exploded perspective view of a conventional heat sink assembly.

FIG. 3 shows a heat sink assembly in accordance with an alternative embodiment of the present invention. The alternative embodiment is similar to the preferred embodiment, except that the alternative embodiment comprises a fixing device 10'. The fixing device 10' comprises a base 12', two side plates 16' extending upwardly from opposite sides of the base 12' respectively, and an upper plate 18' connecting with upper ends of the two sides plates 16'. An opening 20' is defined in the upper plate 18' such that the upper plate 18' comprises two separate portions. Two spaced threaded holes 22' are defined in each of the separate portions.

It is understood that the invention may be embodied in other forms without departing from the spirit thereof. Thus, the present examples and embodiments are to be considered in all respects as illustrative and not restrictive, and the invention is not to be limited to the details given herein.

What is claimed is:

1. A heat sink assembly comprising:

an integrally formed one-piece fixing device defining on a lower portion a base, a pair of opposite side plates upwardly extending from two opposite sides of the base, on an upper portion an upper plate located between said pair of opposite side plates and vertically opposite to said base, the base being engaged with a heat generating electronic device thereunder and the upper plate providing an upward top face, a confined space defined among said base, said upper plate and said pair of opposite side plates, the upper plate being located right above the space;

a folded fin member received in the space and engaged with an upper surface of the base; and a fan fixedly attached to the upward top face of the fixing device; wherein a vertical dimension of the space is larger than that of the folded fin member so as to have an upper end of said folded fin member is spaced from the upper plate.

* * * * *